United States Patent
Kon et al.

(10) Patent No.: US 7,856,075 B2
(45) Date of Patent: Dec. 21, 2010

(54) CLOCK SUPPLY CIRCUIT AND CLOCK SUPPLY METHOD

(75) Inventors: Makoto Kon, Tokyo (JP); Keiichi Okuyama, Tokyo (JP)

(73) Assignee: NEC Corporation, Tokyo (JP)

( * ) Notice: Subject to any disclaimer, the term of this patent is extended or adjusted under 35 U.S.C. 154(b) by 661 days.

(21) Appl. No.: 11/842,432

(22) Filed: Aug. 21, 2007

(65) Prior Publication Data

US 2008/0069285 A1    Mar. 20, 2008

(30) Foreign Application Priority Data

Aug. 22, 2006   (JP)   ............... 2006-225645

(51) Int. Cl.
*H03D 3/24*   (2006.01)
(52) U.S. Cl. ................................... 375/376
(58) Field of Classification Search ........... 375/357, 375/376; 331/1 R, 18, 25; 327/156, 159
See application file for complete search history.

(56) References Cited

U.S. PATENT DOCUMENTS 5,260,979 A * 11/1993 Parker et al. ............... 375/366
5,530,389 A    6/1996 Rieder
5,572,167 A   11/1996 Alder et al.
6,687,322 B1 * 2/2004 Zhang et al. ............... 375/376

FOREIGN PATENT DOCUMENTS

JP    2002232407    8/2002
WO    97/20393      6/1997

OTHER PUBLICATIONS

European Patent Office issued an European Office Action dated Jul. 2, 2009, Application No. 07 144 599.9.

* cited by examiner

*Primary Examiner*—Don N Vo
(74) *Attorney, Agent, or Firm*—Young & Thompson

(57) ABSTRACT

The present invention provides a clock supply device and a clock supply method by which the holdover characteristics that maintains with high precision the same frequency as the frequency observed immediately before an error can be achieved simply with the addition of a high stability oscillator. An output clock signal that is output from a conventional PLL circuit is monitored with a clock signal of a high-stability fixed oscillator, and the monitor result is written in a memory. A holdover reference generating circuit averages the result written over a certain period of time. When a frequency error monitoring circuit detects a frequency error in an input reference signal, a selector selects a holdover reference, instead of the input reference signal, and inputs the holdover reference to the PLL circuit. Alternatively, the holdover reference generating circuit may select the input of the PLL circuit at the time of an error, and then perform holdover.

9 Claims, 9 Drawing Sheets

FIG. 3

+1(+0.025ppm)

| REFERENCE NUMBER | VALUE TO BE LATCHED | A ≦ B | B − A | COUNT VALUE |
|---|---|---|---|---|
| 1 | 1 | 0 | − | 20000 |
| 2 | 2 | 0 | − | 20000 |
| 3 | 3 | 0 | − | 20000 |
| 4 | 4 | 0 | − | 20000 |
| 5 | 5 | 0 | − | 20000 |
| ⋮ | ⋮ | ⋮ | ⋮ | ⋮ |
| 1996 | 1996 | 0 | − | 20000 |
| 1997 | 1997 | 0 | − | 20000 |
| 1998 | 1998 | 0 | − | 20000 |
| 1999 | 1999 | 0 | − | 20000 |
| 2000 | 2000 | 1 | 0 | 19999 |
| 2001 | 1 | 0 | − | 20000 |
| 2002 | 2 | 0 | − | 20000 |
| 2003 | 3 | 0 | − | 20000 |
| 2004 | 4 | 0 | − | 20000 |
| 2005 | 5 | 0 | − | 20000 |
| ⋮ | ⋮ | ⋮ | ⋮ | ⋮ |
| 3996 | 1996 | 0 | − | 20000 |
| 3997 | 1997 | 0 | − | 20000 |
| 3998 | 1998 | 0 | − | 20000 |
| 3999 | 1999 | 0 | − | 20000 |
| 4000 | 2000 | 1 | 0 | 19999 |
| ⋮ | ⋮ | ⋮ | ⋮ | ⋮ |

FIG. 4

−1(−0.025ppm)

| REFERENCE NUMBER | VALUE TO BE LATCHED | A ≦ B | B − A | COUNT VALUE |
|---|---|---|---|---|
| 1 | 1 | 0 | − | 20000 |
| 2 | 2 | 0 | − | 20000 |
| 3 | 3 | 0 | − | 20000 |
| 4 | 4 | 0 | − | 20000 |
| 5 | 5 | 0 | − | 20000 |
| ⋮ | ⋮ | ⋮ | ⋮ | ⋮ |
| 1996 | 1996 | 0 | − | 20000 |
| 1997 | 1997 | 0 | − | 20000 |
| 1998 | 1998 | 0 | − | 20000 |
| 1999 | 1999 | 0 | − | 20000 |
| 2000 | 2000 | 1 | 0 | 20001 |
| 2001 | 1 | 0 | − | 20000 |
| 2002 | 2 | 0 | − | 20000 |
| 2003 | 3 | 0 | − | 20000 |
| 2004 | 4 | 0 | − | 20000 |
| 2005 | 5 | 0 | − | 20000 |
| ⋮ | ⋮ | ⋮ | ⋮ | ⋮ |
| 3996 | 1996 | 0 | − | 20000 |
| 3997 | 1997 | 0 | − | 20000 |
| 3998 | 1998 | 0 | − | 20000 |
| 3999 | 1999 | 0 | − | 20000 |
| 4000 | 2000 | 1 | 0 | 20001 |
| ⋮ | ⋮ | ⋮ | ⋮ | ⋮ |

FIG. 5

+400(+10ppm)

| REFERENCE NUMBER | VALUE TO BE LATCHED | A ≦ B | B − A | COUNT VALUE |
|---|---|---|---|---|
| 1 | 400 | 0 | − | 20000 |
| 2 | 800 | 0 | − | 20000 |
| 3 | 1200 | 0 | − | 20000 |
| 4 | 1600 | 0 | − | 20000 |
| 5 | 2000 | 1 | 0 | 19999 |
| 6 | 400 | 0 | − | 20000 |
| 7 | 800 | 0 | − | 20000 |
| 8 | 1200 | 0 | − | 20000 |
| 9 | 1600 | 0 | − | 20000 |
| 10 | 2000 | 1 | 0 | 19999 |
| 11 | 400 | 0 | − | 20000 |
| 12 | 800 | 0 | − | 20000 |
| 13 | 1200 | 0 | − | 20000 |
| 14 | 1600 | 0 | − | 20000 |
| 15 | 2000 | 1 | 0 | 19999 |
| 16 | 400 | 0 | − | 20000 |
| 17 | 800 | 0 | − | 20000 |
| 18 | 1200 | 0 | − | 20000 |
| 19 | 1600 | 0 | − | 20000 |
| 20 | 2000 | 1 | 0 | 19999 |
| ⁞ | ⁞ | ⁞ | ⁞ | ⁞ |
| 2000 | 2000 | 1 | 0 | 19999 |
| ⁞ | ⁞ | ⁞ | ⁞ | ⁞ |

FIG. 6

+600(+15ppm)

| REFERENCE NUMBER | VALUE TO BE LATCHED | A ≦ B | B − A | COUNT VALUE |
|---|---|---|---|---|
| 1 | 600 | 0 | − | 20000 |
| 2 | 1200 | 0 | − | 20000 |
| 3 | 1800 | 0 | − | 20000 |
| 4 | 2400 | 1 | 400 | 19999 |
| 5 | 1000 | 0 | − | 20000 |
| 6 | 1600 | 0 | − | 20000 |
| 7 | 2200 | 1 | 200 | 19999 |
| 8 | 800 | 0 | − | 20000 |
| 9 | 1400 | 0 | − | 20000 |
| 10 | 2000 | 1 | 0 | 19999 |
| 11 | 600 | 0 | − | 20000 |
| 12 | 1200 | 0 | − | 20000 |
| 13 | 1800 | 0 | − | 20000 |
| 14 | 2400 | 1 | 400 | 19999 |
| 15 | 1000 | 0 | − | 20000 |
| 16 | 1600 | 0 | − | 20000 |
| 17 | 2200 | 1 | 200 | 19999 |
| 18 | 800 | 0 | − | 20000 |
| 19 | 1400 | 0 | − | 20000 |
| 20 | 2000 | 1 | 0 | 19999 |
| ⋮ | ⋮ | ⋮ | ⋮ | ⋮ |
| 2000 | 2000 | 1 | 0 | 19999 |
| ⋮ | ⋮ | ⋮ | ⋮ | ⋮ |

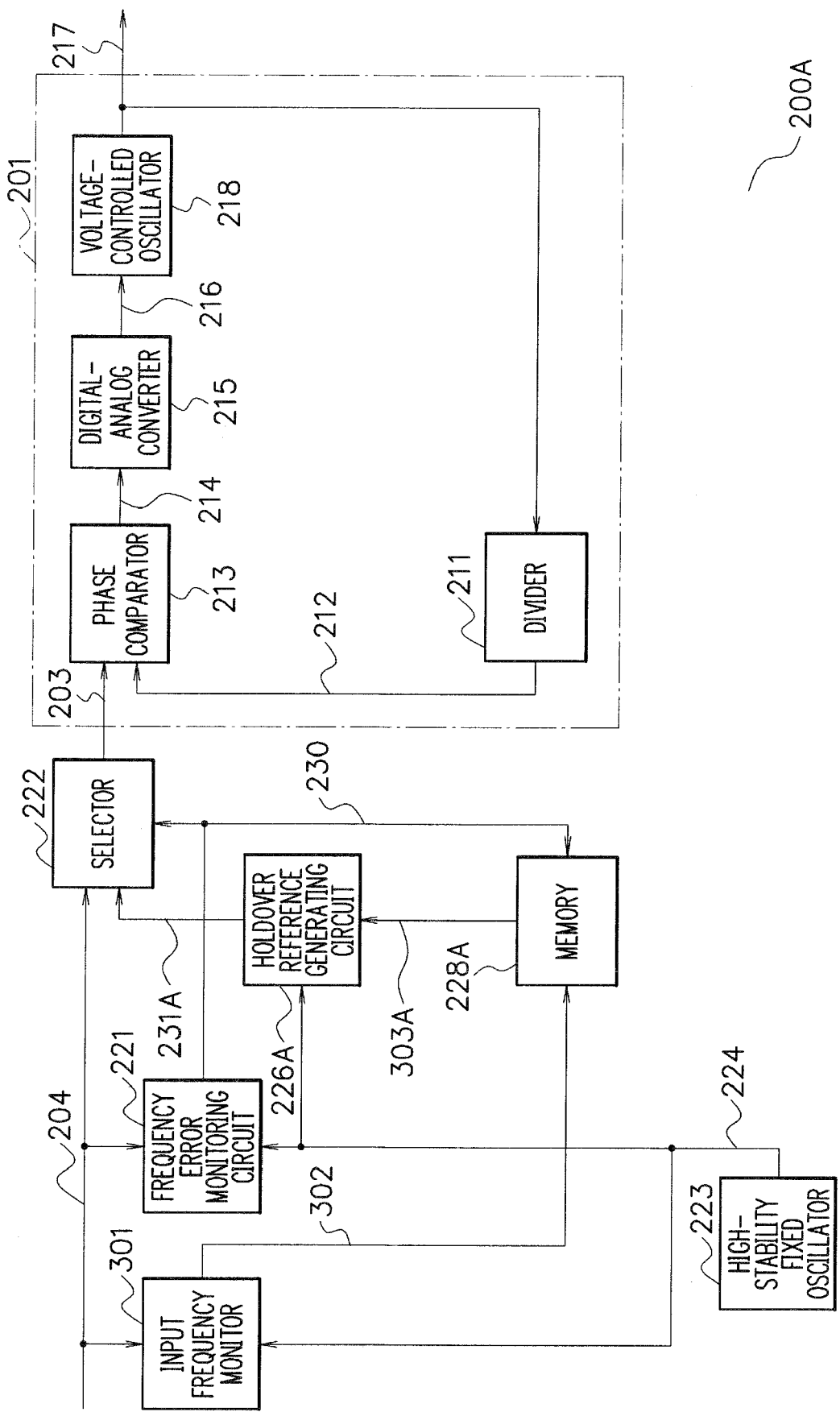
F I G. 7

US 7,856,075 B2

CLOCK SUPPLY CIRCUIT AND CLOCK SUPPLY METHOD

This application is based upon and claims the benefit of priority from Japanese patent application No. 2006-225645, filed on Aug. 22, 2006, the disclosure of which is incorporated herein in its entirety by reference.

BACKGROUND OF THE INVENTION

1. Field of the Invention

The present invention pertains to a clock supply device and a clock supply method for supplying clocks to a predetermined circuit device, and more particularly, to a clock supply device and a clock supply method by which high-precision clocks are supplied to a predetermined circuit device with the use of a holdover function that is attached to the PLL circuit of the clock supply device, even if an error occurs in the input frequency in a device that manages frequencies.

2. Description of the Related Art

There has been a clock supply device that is designed to generate a clock in phase synchronization with the frequency of an input reference signal serving as a reference, and also generate a different clock with a frequency that is generated in the past, instead of the above clock, in a case where an error occurs in the input reference signal. Such a clock supply device has a holdover function attached to a PLL (Phase Locked Loop) circuit. The holdover function is designed to output a clock having the same frequency as the clock that is output immediately before an error.

In such a clock supply device, it is necessary to maintain the same frequency with high precision over a long period of time after an error occurs in the input reference signal. To achieve this effect, a technique has been suggested to select a clock signal determined to have the highest quality among clock signals obtained as results of dividing operations by divider circuits in the PLL circuit, and to use the selected clock signal at the time of holdover (see Japanese Patent Application Laid-Open No. 2002-232407 (paragraph [0006], FIG. 1), for example).

By the suggested technique, the divider circuits divide extracted clocks into phase comparison frequencies, so as to obtain divided input clocks. A select signal generating circuit selects the divided input clock determined to have the highest quality, based on detection quality information and input break information. Therefore, the circuit size to accommodate those operations becomes larger. Also, even if the clock signal determined to have the highest quality is selected, the quality of the function to maintain the frequency of the selected clock signal is questionable. To counter those problems, the use of a voltage-controlled oscillator with high stability has been suggested to increase the reliability of the PLL circuit at the time of holdover.

FIG. 9 shows a conventional clock supply device that has a high stability voltage-controlled oscillator provided in a PLL circuit. The clock supply device 100 has a holdover circuit unit 102 attached to a PLL circuit 101.

Here, the PLL circuit 101 includes: a phase comparator 113 that compares the phase of an input reference signal 103 with the phase of an output 112 of a divider 111; a memory 115 that has the phase comparison result 114 written therein; a selector 117 that receives the phase comparison result 114 and an output 116 of the memory 115, and selects either the result 114 or the output 116; a digital-analog converter 119 that receives an output 118 of the selector 117, and converts the output 118 into an analog signal; and a high-stability voltage-controlled oscillator 122 that receives an output 120 of the digital-analog converter 119, and outputs an output clock signal 121 having a frequency according to the output 120. The output clock signal 121 output from the high-stability voltage-controlled oscillator 122 serves as an output signal of the PLL circuit 101, and also branches into the divider 111. In the PLL circuit 101 having such a structure, the high-stability voltage-controlled oscillator 122 oscillates at a frequency corresponding to a voltage according to the phase difference between the input reference signal 103 having the predetermined frequency and the output 112 of the divider 111. Accordingly, the output clock signal 121 having the frequency according to the dividing rate of the divider 111 is output.

The memory 115 and the selector 117 provided on the output side of the memory 115 forms a part of the holdover circuit unit 102, and receive a monitor result 132 from a frequency error monitoring circuit 131. Here, the frequency error monitoring circuit 131 receives both the input reference signal 103 and a clock signal 134 output from a high-stability fixed oscillator 133, and monitors occurrences of frequency errors such as breaking of the input reference signal 103. The memory 115 stores the phase comparison result 114 from the phase comparator 113 as a digital value. When the frequency error monitoring circuit 131 detects an error in the input reference signal 103, the selector 117 selects a digital value stored before the error detection, so as to realize a holdover state.

In a case where an error is not detected in the frequency of the input reference signal 103, the selector 117 selects and sets the phase comparison result 114 as the output 118. In a case where an error is detected in the frequency of the input reference signal 103, the selector 117 selects the output 116 of the memory 115, instead. The digital-analog converter 119 then converts the selected value into analog data. The high-stability voltage-controlled oscillator 122 then generates the output clock signal 121 with high stability, based on the frequency corresponding to the analog data as a fixed value. In this manner, the substitute frequency can be maintained when an error occurs.

An example of a conventional clock supply device has been described above. The voltage-controlled oscillator formed with the phase comparator 113, the digital-analog converter 119, the divider 111 and the high-stability voltage-controlled oscillator 122, which are the fundamental components of the PLL circuit 101, is well known to those skilled in the art. Therefore, explanation of the operation to be performed by the voltage-controlled oscillator is omitted here.

The above clock supply device as a PLL circuit equipped with a conventional holdover function has the problem of requiring a high-stability fixed oscillator for detecting with high precision the frequency output from the PLL circuit immediately before a frequency error occurs. To maintain the frequency observed immediately before the error and achieve the holdover characteristics satisfying certain standards after the error occurrence, it is necessary to use the high-stability voltage-controlled oscillator 112 that receives a high-precision frequency detected as the frequency output immediately before the error, and can oscillate in a stable manner even when an environmental change such as a temperature change occurs within an allowable error range. In this manner, the high-stability voltage-controlled oscillator 122, instead of a voltage-controlled oscillator normally used in a PLL circuit, is necessary.

As described above, the conventional clock supply device equipped with the holdover function requires two high stability oscillators in one circuit. Those high stability oscillators involve other additional components such as circuit components for maintaining the same temperature so as to stabilize oscillations. As a result, the device size becomes physically large, and the production costs and the product prices also become high.

SUMMARY OF THE INVENTION

An exemplary object of the invention is to provide a clock supply device and a clock supply method by which desired holdover characteristics can be achieved simply with the addition of one high stability oscillator.

The present invention also aims to provide a clock supply device and a clock supply method by which the holdover characteristics that maintains the same frequency as the frequency observed immediately before an error can be achieved with the use of a conventional PLL circuit.

A clock supply circuit according to an exemplary aspect of the invention includes an averaging unit that inverse-quantizes digital signals, averages the digital signals over a certain period of time, and sequentially outputs the averaged digital signals wherein the averaged digital signals are selected instead of input signals when frequency errors are found in the input signals.

A clock supply circuit according to an exemplary aspect of the invention includes: a PLL circuit that includes a divider and a voltage-controlled oscillator, the voltage-controlled oscillator outputting an output signal to the outside, the output signal having a frequency in phase synchronization with an input signal in accordance with the dividing rate of the divider; an output frequency value storing unit that stores a digital signal obtained by sampling and quantizing the frequency of the output signal of the PLL circuit, the digital signal being sequentially stored in chronological order; an error detecting unit that detects a frequency error in the input signal to be input to the PLL circuit; and signal switching unit that sequentially inputs a signal, instead of the input signal, to the PLL circuit after the error detecting unit detects a frequency error in the input signal, the signal having a frequency inverse-quantized in accordance with the dividing rate of the divider, the signal being output from the averaging unit.

A clock supply circuit according to an exemplary aspect of the invention includes: a PLL circuit that includes a divider and a voltage-controlled oscillator, the voltage-controlled oscillator outputting an output signal to the outside, the output signal having a frequency in phase synchronization with an input signal in accordance with the dividing rate of the divider; an input frequency value storing unit that stores a digital signal obtained by sampling and quantizing the frequency of the input signal of the PLL circuit, the digital signal being sequentially stored in chronological order; an error detecting unit that detects a frequency error in the input signal to be input to the PLL circuit; and a signal switching unit that sequentially inputs a signal, instead of the input signal, to the PLL circuit after the error detecting unit detects a frequency error in the input signal, the signal having a frequency inverse-quantized, the signal being output from the averaging unit.

A clock supply circuit according to an exemplary aspect of the invention includes: a PLL circuit that includes a divider and a voltage-controlled oscillator, the voltage-controlled oscillator outputting an output signal to the outside, the output signal having a frequency in phase synchronization with an input signal in accordance with a dividing rate of the divider; an output frequency value storing unit that stores a digital signal obtained by sampling and quantizing the frequency of the output signal of the PLL circuit, the digital signal being sequentially stored in chronological order; an input frequency value storing unit that stores a digital signal obtained by sampling and quantizing the frequency of the input signal of the PLL circuit, the digital signal being sequentially stored in chronological order; an error detecting unit that detects a frequency error in the input signal to be input to the PLL circuit; a phase synchronization completion determining unit that determines whether phase synchronization of the PLL circuit is completed; and a signal switching unit that sequentially inputs a signal, instead of the input signal, to the PLL circuit after the error detecting unit detects a frequency error in the input signal to be input to the PLL signal where the phase synchronization completion determining unit determines that the phase synchronization is not completed, the signal having a frequency inverse-quantized and being output from the averaging unit, the signal switching unit also sequentially inputting a signal, instead of the input signal, to the PLL circuit after the error detecting unit detects a frequency error in the input signal to be input to the PLL signal where the phase synchronization completion determining unit determines that the phase synchronization is completed, the signal having a frequency inverse-quantized in accordance with the dividing rate of the divider, the signal being output from the averaging unit.

A clock supply method according to an exemplary aspect of the invention includes the steps of: sequentially receiving digital signals in chronological order, inverse-quantizing the digital signals, averaging digital signals over a certain period of time, wherein the averaged digital signals are selected instead of input signals when frequency errors are found in the input signals.

A clock supply method according to an exemplary aspect of the invention includes: sequentially outputting the averaged digital signal, the digital signal being obtained by sampling and quantizing the frequency of an output signal of a PLL circuit that includes a divider and a voltage-controlled oscillator, the voltage-controlled oscillator outputting the output signal to the outside, the output signal having a frequency in phase synchronization with an input signal in accordance with a dividing rate of the divider; an error detecting step of detecting a frequency error in the input signal of the PLL circuit by comparing the frequency of the input signal with a predetermined oscillation output; and a signal switching step of sequentially inputting a signal, instead of the input signal, to the PLL circuit after a frequency error in the input signal of the PLL circuit is detected in the error detecting step, the signal having a frequency inverse-quantized in accordance with the dividing rate of the divider, the signal being sequentially output as a result of the averaging step.

A clock supply method according to an exemplary aspect of the invention includes: sequentially outputting the averaged digital signal, the digital signal being obtained by sampling and quantizing the frequency of an input signal of a PLL circuit that includes a divider and a voltage-controlled oscillator, the voltage-controlled oscillator outputting an output signal to the outside, the output signal having a frequency in phase synchronization with the input signal in accordance with a dividing rate of the divider; an error detecting step of detecting a frequency error in the input signal of the PLL circuit by comparing the frequency of the input signal with a predetermined oscillation output; and a signal switching step of sequentially inputting a signal, instead of the input signal, to the PLL circuit after a frequency error in the input signal of the PLL circuit is detected in the error detecting step, the signal having a frequency inverse-quantized and being sequentially output as a result of the averaging step.

A clock supply method according to an exemplary aspect of the invention includes: sequentially outputting the averaged digital signals via different routes from each other, one of the digital signals being obtained by sampling and quantizing the frequency of an output signal of a PLL circuit that includes a divider and a voltage-controlled oscillator, the voltage-controlled oscillator outputting the output signal to the outside, the output signal having a frequency in phase synchronization with an input signal in accordance with a dividing rate of the divider, the other one of the digital signal being obtained by sampling and quantizing the frequency of the input signal of the PLL circuit; an error detecting step of detecting a frequency error in the input signal of the PLL circuit by comparing the frequency of the input signal with a predetermined oscillation output; a phase synchronization completion determining step of determining whether phase synchronization of the PLL circuit is completed; and a signal switching step of sequentially inputting a signal, instead of the input signal, to the PLL circuit after a frequency error in the input signal to be input to the PLL circuit is detected in the error detecting step where the phase synchronization is determined not to be completed in the determining step, the signal having a frequency inverse-quantized and being output as a result of the averaging step, while sequentially inputting a signal, instead of the input signal, to the PLL circuit after a frequency error in the input signal to be input to the PLL circuit is detected in the error detecting step where the phase synchronization is determined to be completed in the determining step, the signal having a frequency inverse-quantized in accordance with the dividing rate of the divider, the signal being output as a result of the averaging step.

A holdover circuit according to an exemplary aspect of the invention is connected to a PLL circuit and includes: a unit that outputs variable signals; and a selector that selects the variable signals instead of input signals when frequency errors are found in the input signals, and outputs selected signals to the PLL circuit.

BRIEF DESCRIPTION OF THE DRAWINGS

Features of the disclosed embodiments will be described by way of the following detailed description with reference to the accompanying drawings in which:

FIG. 3 shows variations of values observed in the holdover reference generating circuit when the output frequency monitor value is "+1" in this embodiment;

FIG. 4 shows variations of values observed in the holdover reference generating circuit when the output frequency monitor value is "−1" in this embodiment;

FIG. 5 shows variations of values observed in the holdover reference generating circuit when the output frequency monitor value is "+400" in this embodiment;

FIG. 6 shows variations of values observed in the holdover reference generating circuit when the output frequency monitor value is "+600" in this embodiment;

FIG. 7 is a block diagram schematically showing the structure of a clock supply device in a first modification of the present invention;

DESCRIPTION OF EXEMPLARY EMBODIMENTS

The following is a detailed description of exemplary embodiments of the present invention, with reference to the accompanying drawings.

First Exemplary Embodiment

Figure 1:
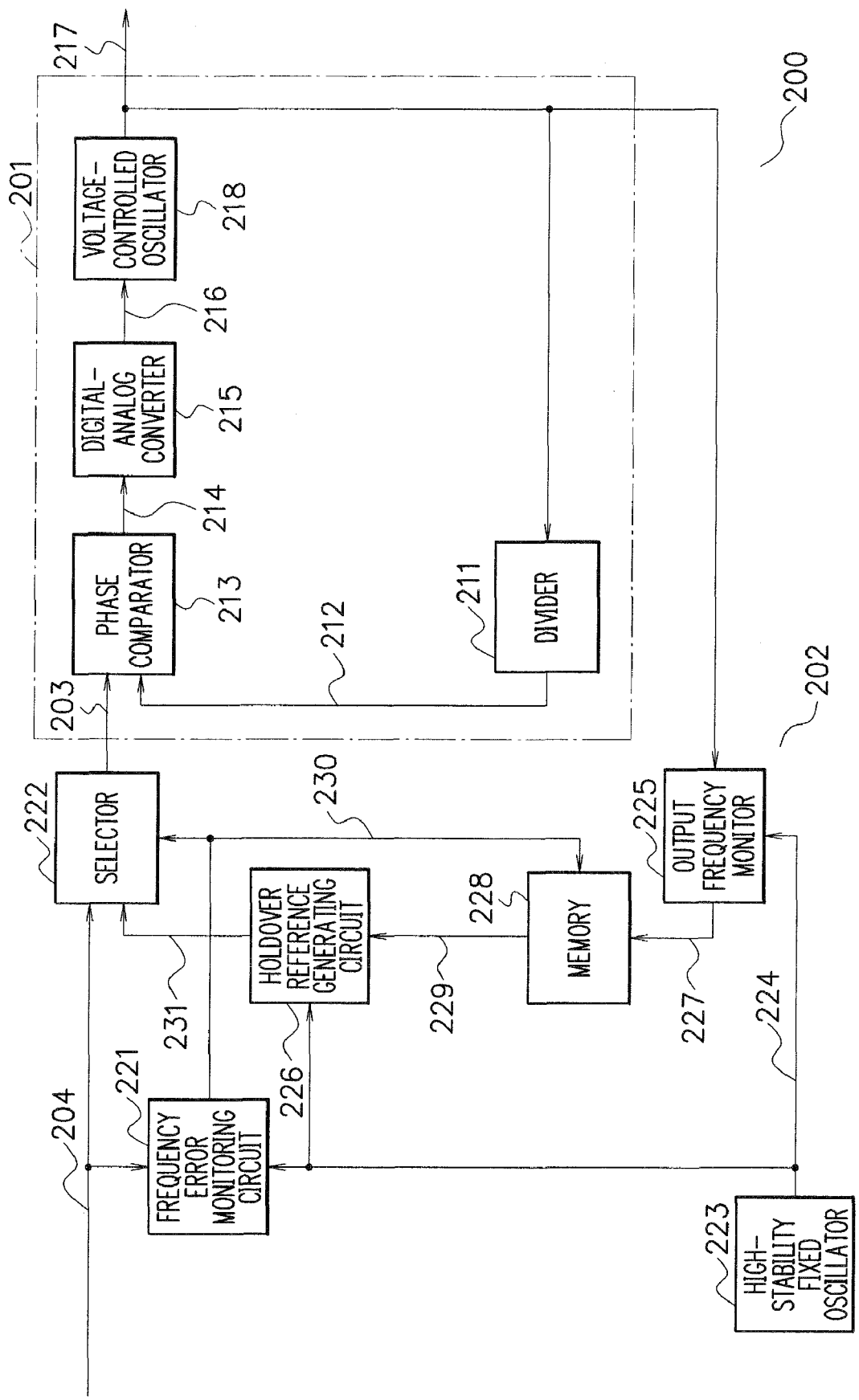
FIG. 1 is a block diagram schematically showing the structure of a clock supply device in an embodiment of the present invention.

FIG. 1 schematically shows the structure of a clock supply device in accordance with one embodiment of the present invention. The clock supply device 200 has a holdover circuit unit 202 attached to a conventional PLL circuit 201 from the outside. The holdover circuit unit 202 has a holdover function. The PLL circuit 201 includes a phase comparator 213 that compares the phase of a signal 203 supplied from the holdover circuit unit 202 with the phase of an output 212 of a divider 211, a digital-analog converter 215 that receives a phase comparison result 214 and converts the result 214 into an analog signal, and a voltage-controlled oscillator 218 that receives an output 216 of the digital-analog converter 215 and outputs an output clock signal 217 having a frequency according to the output 216. The output clock signal 217 that is output from the voltage-controlled oscillator 218 serves as an output signal of the PLL circuit 201, and also branches into the divider 211. In the PLL circuit 201, the voltage-controlled oscillator 218 oscillates at a frequency corresponding to the voltage in accordance with the phase difference between the signal 201 having a predetermined frequency and the output 212 of the divider 211. As a result, the output clock signal 217 according to the dividing ratio of the divider 211 is output from the clock supply device 200.

An input reference signal 204 as a signal to be input to the clock supply device 200 is input to a frequency error monitoring circuit 221 and a selector 222 of the holdover circuit unit 202. The frequency error monitoring circuit 221 receives a clock signal 224 that is output from a high-stability fixed oscillator 223, and monitors frequency errors such as breaking of the input reference signal 204. The clock signal 224 is also supplied to an output frequency monitor 225 and a holdover reference generating circuit 226.

Here, the output frequency monitor 225 compares the frequency of the output clock signal 217 output from the PLL circuit 201 with the high-stability clock signal 224. The output frequency monitor 225 then outputs a digital value 227 that has a positive or negative sign indicating whether the frequency has increased or decreased when the frequency of the output clock signal 217 is compared with the frequency of the clock signal 224 at a predetermined rate. The digital value 227 is obtained by quantizing the increase or decrease.

When the PLL circuit 201 is in a phase synchronized state, the output clock signal 217 according to the frequency of the input reference signal 204 is accurately output as the mean value over a certain period of time. Accordingly, the digital value 227 stored as the result of reference to the high-stability clock signal 224 in a memory 228 can have reasonable accuracy, when seen as the time-mean value. Even if an output frequency monitor value 229 that is input to the holdover reference generating circuit 226 from the memory 228 varies, the time-mean value of the output frequency monitor value 229 can have reasonable accuracy. On the other hand, the input reference signal 204 that is one of the inputs to the selector 222 does not have an error in principle, being the signal to be input to the PLL circuit 201 and to be referred to.

A monitor result 230 of the frequency error monitoring circuit 221 is input to the selector 222. A holdover reference 231 that is output from the holdover reference generating circuit 226 is also input to the selector 222 together with the input reference signal 204 as the signals to be selected.

In this embodiment, the output clock signal 217 at the time of holdover always falls within a predetermined error range in terms of frequency. Therefore, the holdover reference generating circuit 226 is designed to generate a digital value as the holdover reference 231. The digital value is obtained by time-averaging the output frequency monitor value 229 that is input every time holdover is performed. At the time of holdover, the holdover reference 231 as the frequency information, instead of the input reference signal 204, is selected by the selector 222 and is input to the PLL circuit 201. The PLL circuit 201 then performs phase synchronization, following the holdover reference 231 as a value that varies with time.

Figure 9:
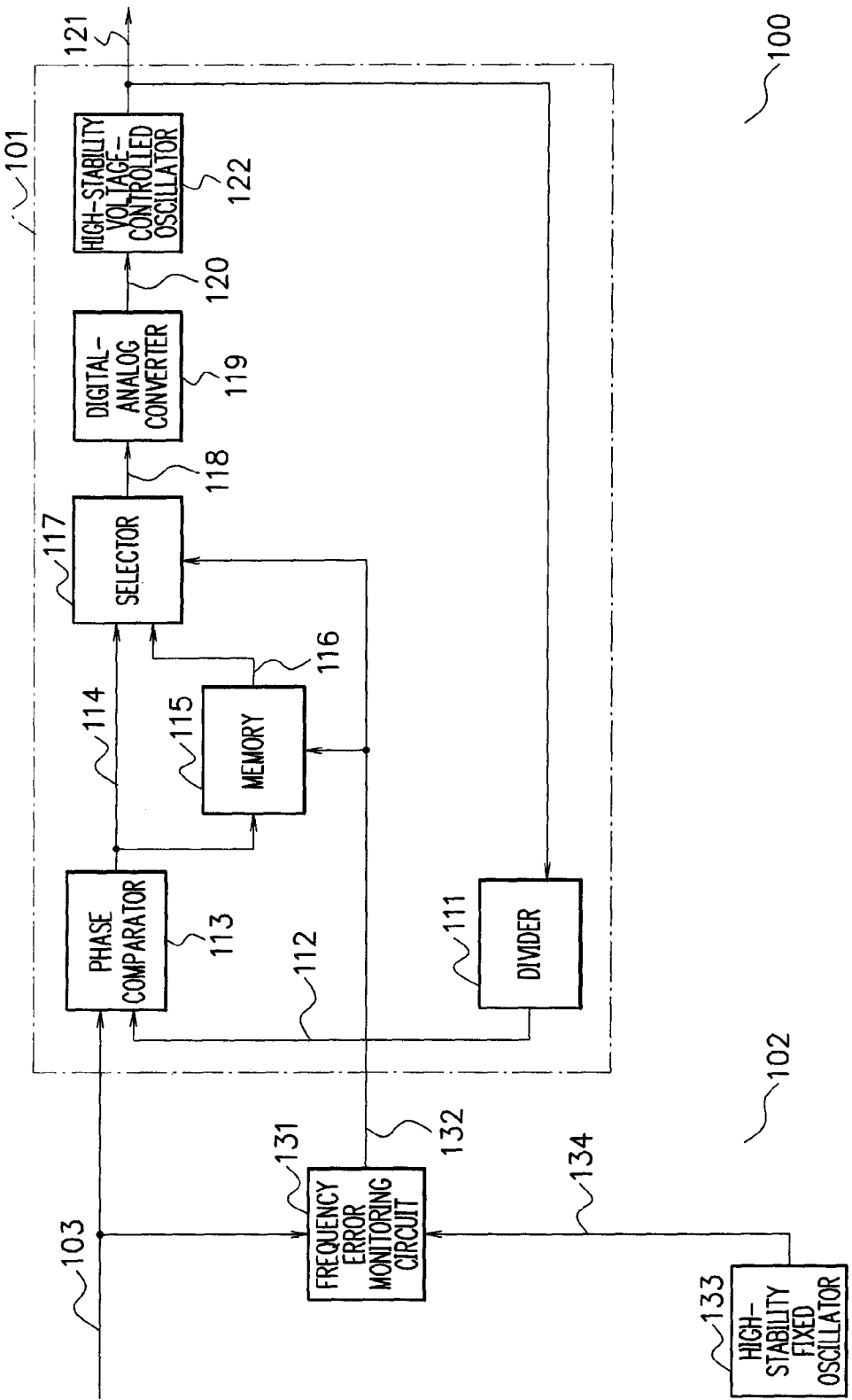
FIG. 9 is a block diagram sowing a conventional clock supply device that uses a high stability voltage-controlled oscillator in a PLL circuit.

As a result, the frequency of the output clock signal 217 can be restrained within the predetermined range, with the use of the voltage-controlled oscillator 218 that has regular accuracy. It is of course possible to restrain the accumulated error of the output clock signal 217 within an allowable range. In other words, the holdover reference 231 being a variable, not fixed, output fundamentally differs from the output 116 of the conventional memory 115 shown in FIG. 9.

In the above described clock supply device 200, the divider 211, the phase comparator 213, the digital-analog converter 215, and the voltage-controlled oscillator 218 are typical circuit components that constitute the PLL circuit 201. The clock supply device 200 has a more principled design than the PLL circuit 101 shown in FIG. 9, which contains the holdover circuit unit. Therefore, detailed explanation of the circuit components of the PLL circuit 201 of this embodiment is omitted here.

Figure 2:
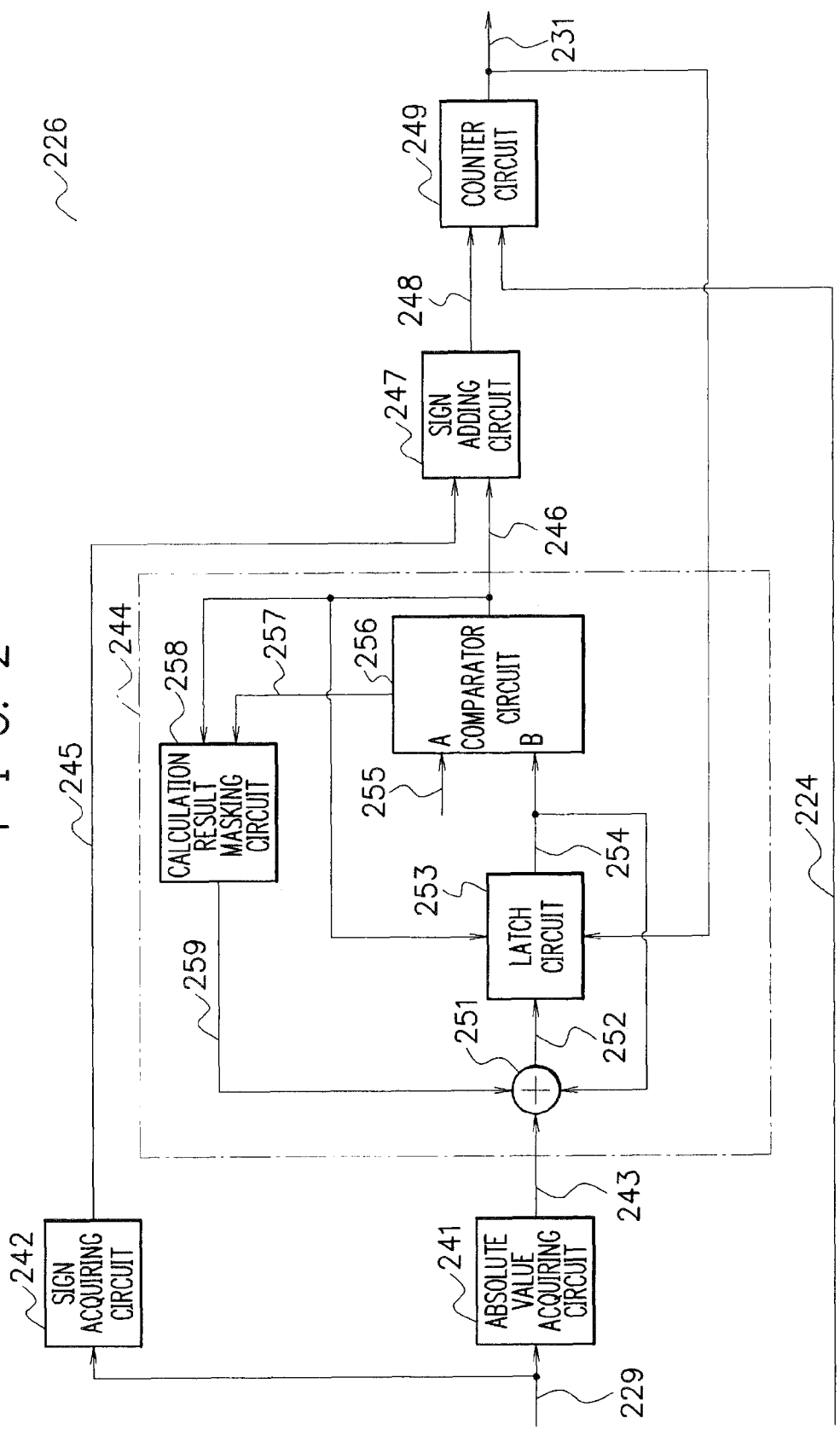
FIG. 2 is a block diagram illustrating the structure of the holdover reference generating circuit shown in FIG. 1.

FIG. 2 shows the structure of the holdover reference generating circuit 226 shown in FIG. 1. The holdover reference generating circuit 226 in the holdover circuit unit 202 shown in FIG. 1 receives the output frequency monitor value 229 that is output from the memory 228 shown in FIG. 1. The holdover reference generating circuit 226 then inputs the output frequency monitor value 229 to both an absolute value acquiring circuit 241 and a sign acquiring circuit 242.

The output frequency monitor value 229 is a digital signal that represents a binary number with eight bits. Among the eight bits, the top bit represents whether the number is a positive or negative number. In this embodiment, "0" indicates that the number is a positive number, and "1" indicates that the number is a negative number. The other seven bits indicate an absolute value representing the size of the value as the output frequency monitor value 229.

The absolute value acquiring circuit 241 is a circuit that acquires an absolute value from the eight bits of the output frequency monitor value 229 output from the memory 228 (FIG. 1) minus the top bit representing the positive or negative signs. The sign acquiring circuit 242 is designed to acquire the top bit of the output frequency monitor value 229 as the positive or negative sign. The sign 245 of the input value acquired by the sign acquiring circuit 242 and an output value 246 as the comparison result of a counter circuit 244 for random walk filters are input to a sign adding circuit 247, and are turned back into an 8-bit digital signal. The output value 246 from counter circuit 244 for random walk filters is a signal of "1", "0", representing a change or no changes in frequency. Accordingly, a load value 248 that is output from the sign adding circuit 247 is "−1", "0", or "+1", having the positive or negative sign added to the signal value.

A counter circuit 249 receives the clock signal 224 that is output from the high-stability fixed oscillator 223 shown in FIG. 1, and loads the load value 248. As a result, the counter circuit 249 outputs the above described holdover reference 231. The holdover reference 231 is also supplied to the counter circuit 244 for random walk filters.

The counter circuit 244 for random walk filters includes an adder 251, a latch circuit 253 that latches an output 252 of the adder 251, a comparator circuit 256 that performs a predetermined comparison by subtracting a latch output 254 of the latch circuit 253 from a count number 255 required for an averaging operation, and a calculation result masking circuit 258 that receives a calculation result 257 of the comparator circuit 256 subtracting the latch output 254 from the count number 255. The latch circuit 253 receives the above described holdover reference 231 as a latch timing signal, and also receives the output value 246 of the comparison result of the comparator circuit 256 as a reset signal. The calculation result masking circuit 258 masks the calculation result 257 when the output value 246 is "0". The adder 251 adds a mask output 259 of the calculation result masking circuit 258, the latch output 254, and the absolute value 243 output from the absolute value acquiring circuit 241. An output 252 of the adder 251 is then input to the latch circuit 253.

The operation to be performed by the holdover reference generating circuit 226 having the above structure will be described later in detail. The circuit characteristics the clock supply device 200 of this embodiment needs to have are now described. In this embodiment, the clock signal 224 output from the high-stability fixed oscillator 223 is 40 MHz, and the holdover reference generating circuit 226 generates the holdover reference 231 of 2 KHz, using the clock signal 224.

The holdover characteristics the holdover reference generating circuit 226 aims to achieve have an initial offset of ±0.05 ppm (parts per million) with respect to ITU-T (International Telecommunications Union—Telecommunications Standardization Sector) G.813/Telcordia GR-1244. Including the offset, the holdover characteristics the holdover reference generating circuit 226 aims to achieve are ±0.37 ppm. Accordingly, the high-stability fixed oscillator 223 can determine the stability per day, as expressed by the following expression (1):

$$(\pm 0.37 \text{ ppm}) - (\pm 0.05 \text{ ppm}) = \pm 0.32 \text{ ppm}/1 \text{ day} \qquad (1)$$

When the initial offset is set at ±0.05 ppm, the value "1" of the output frequency monitor value 229 of the memory output corresponds to 0.025 ppm, with a margin being taken into consideration. When the output clock frequency is 40 MHz, the high-stability fixed oscillator 223 generates a signal at a frequency of 0.025 ppm. Therefore, the averaging time required for averaging errors is determined to be 1 second in accordance with the following expression (2):

$$1/(40 \text{ MHz} \times 0.025 \text{ ppm}) = 1 \text{ second} \qquad (2)$$

Since the holdover reference 231 output from the holdover reference generating circuit 226 is 2 KHz, and one second is required as the averaging time, the count number required for the averaging is 20000 in accordance with the following expression (3):

$$(\tfrac{1}{2} \text{ KHz})/(\tfrac{1}{40} \text{ MHz}) = 20000 \qquad (3)$$

Further, when the clock frequency of the high-stability fixed oscillator 223 is 40 MHz, a frequency of 2 KHz is generated as the holdover reference 231. Accordingly, the count-up value of the counter circuit 249 is determined to be 20000 in accordance with the following expression (4):

$$(\tfrac{1}{2}\text{ KHz})/(\tfrac{1}{40}\text{ MHz}) = 20000 \quad (4)$$

FIG. 3 shows variations of values observed in the holdover reference generating circuit 226 in a case where the output frequency monitor value 229 is "+1", or a mean frequency of "+0.025" ppm is obtained as the output reference. The following is a description with reference to both FIG. 2 and FIG. 3. As shown in FIG. 3, every time the latch circuit 253 of the holdover reference generating circuit 226 latches a value, the reference number used for explaining the circuit operation is incremented by 1.

Where the reference number is "1", the output frequency monitor value 229 is "+1", and the value latched in the latch circuit 253 is "1". The comparator circuit 256 compares a value "A" that is the count number 255 required for the averaging operation with a value "B" that is the latch output 254 of the latch circuit 253. If the value "A" is larger than the value "B", the comparator circuit 256 outputs a comparison result "0" as the output value 246. If the value "B" is equal to or larger than the value "A", the comparator circuit 256 outputs a comparison result "1" as the output value 246. In this example case, the value "2000" as the value "A" is larger than "1" as the value "B", the output value 246 as the comparison result is "0".

The comparison result "0" as the output value 246 is input to the sign adding circuit 247. The sign adding circuit 247 adds the sign "+" to "0", and outputs "0", which has not changed. Accordingly, the counter circuit 249 loads the initial value "0" as the count value. In this situation, the counter circuit 249 counts the number of times the clock signal 224 of 40 MHz is output from the high-stability fixed oscillator 223 shown in FIG. 1. When the count value becomes "20000", only one clock of the holdover reference 231 is output.

The holdover reference 231 is not only supplied to the PLL circuit 201 via the selector 222 shown in FIG. 1, but also serves as the latch output 254 of the latch circuit 253. In the latch circuit 253, the output 252 of the adder 251 is latched. This is the situation indicated by reference number "2" in FIG. 3.

The output frequency monitor value 229 maintains "+1" in the latch timing indicated by the reference number "2". The adder 251 then adds the absolute value "1", the latch output 254 of the latch circuit 253, and the mask output 259 of the calculation result masking circuit 258. Here, the latch output 254 is "1", which is the value obtained when the reference number is "1". The calculation result 257 obtained by subtracting the value "A" from the value "B", and "0" as the output value 246 are input to the calculation result masking circuit 258. The calculation result masking circuit 258 masks the calculation result 257 when the output value 246 is "0". Accordingly, the calculation result 257 that is "−1999" as a result of "1−2000" is masked in this case, and "0" is input to the adder 251.

As a result, where the reference number is "2", the adder 251 adds "1", "1", and "0", and the value to be latched in the latch circuit 253 becomes "2". The comparator circuit 256 compares the value "2" as the latch output 254 with "2000" that is the count number 255 required for the averaging operation. In this case, the count number 255 "2000" is larger. Therefore, the comparator circuit 256 outputs "0" as the output value 246.

Accordingly, the circuit operation to be performed thereafter where the reference number is "2" is the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

Where the reference number is "3", the adder 251 adds "2" and "1", and the value to be latched in the latch circuit 253 is "3", when the output frequency monitor value 229 is "+1". The comparator circuit 256 compares the value "3" as the latch output 254 with the count number 255 "2000" required for the averaging operation. In this case, the count number 255 "2000" is larger. Therefore, the comparator circuit 256 outputs "0" as the output value 246.

Accordingly, the circuit operation after the reference number is "3" is the same as that performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

Thereafter, the latch output 254 is incremented by 1 in the same manner as above, every time the reference number is incremented by 1. Where the reference number is "2000", and the output frequency monitor value 229 is "+1", the adder 251 adds "1999" and "1", so that the value "2000" is latched by the latch circuit 253. The comparator circuit 256 compares the value "2000" as the latch output 254 with "2000" as the count number 255 required for the averaging operation. In this case, the value "A" as the count number 255 is equal to the value "B" as the latch output 254. Accordingly, the comparator circuit 256 outputs "1" as the output value 246.

Meanwhile, the calculation result 257 of the comparator circuit 256 subtracting the value "A" as the count number 255 from the value "B" as the latch output 254 is "0". When the output value 246 changes from "0" to "1", the sign adding circuit 247 adds "+1", instead of "0", as the sign 245 of the input value. As a result, the counter circuit 249 loads the initial value "+1" as the count value. When the counter circuit 249 detects the clock signal 224 output from the high-stability fixed oscillator 223 for the "19999" the times, the count value becomes "20000", and one clock of the holdover reference 231 is output, although, until this point, one clock of the holdover reference 231 is output every time the counter circuit 249 detects the clock signal 224 for the "20000"th time.

As the output value 246 of the comparator circuit 256 becomes "1", the latch circuit 253 is reset. As a result, where the reference number is "2001", the circuit operation is the same as the circuit operation performed where the reference number is "1". The same procedures as above are repeated thereafter. Where the reference number is "4000", one clock of the holdover reference 231 is output when the clock signal 224 is detected for the "19999"th time, as in the case where the reference number is "2000".

As described above, one clock of the holdover reference 231 is normally output every time the clock signal 224 of 40 MHz is detected for the "20000"th time. However, every time the reference number is incremented for the "2000"th time, one clock of the holdover reference 231 is output when the clock signal 224 is detected for the "19999"th time. In this manner, the number of clocks of the holdover reference 231 per unit time is reduced, so as to correct the output frequency monitor value 229 when the output frequency monitor value 229 is "+1".

In the above described circuit operation, the mask output 259 of the calculation result masking circuit 258 is always "0". Therefore, the calculation result masking circuit 258 does not affect the output 252 of the adder 251. The calculation result masking circuit 258 performs a circuit operation to add the calculation result obtained when the mask is removed to the output 252 of the adder 251. This circuit operation will be described later.

FIG. 4 shows variations of values observed in the holdover reference generating circuit 226 in a case where the output frequency monitor value 229 is "−1", or a mean frequency of "−0.025" is obtained as the output reference. The following is a description with reference to both FIG. 2 and FIG. 4. As shown in FIG. 4, every time the latch circuit 253 of the holdover reference generating circuit 226 latches a value, the reference number used for explaining the circuit operation is incremented by 1.

Where the reference number is "1", the output frequency monitor value 229 is "−1", and the value latched in the latch circuit 253 is "1". The comparator circuit 256 compares a value "A" that is the count number 255 required for the averaging operation with a value "B" that is the latch output 254 of the latch circuit 253. If the value "A" is larger than the value "B", the comparator circuit 256 outputs a comparison result "0" as the output value 246. If the value "B" is equal to or larger than the value "A", the comparator circuit 256 outputs a comparison result "1" as the output value 246. In this example case, the value "2000" as the value "A" is larger than "1" as the value "B", the output value 246 as the comparison result is "0".

The comparison result "0" as the output value 246 is input to the sign adding circuit 247. The sign adding circuit 247 adds the sign "−" to "0", and outputs "0", which remains unchanged. Accordingly, the counter circuit 249 loads the initial value "0" as the count value. In this situation, the counter circuit 249 counts the number of times the clock signal 224 of 40 MHz is output from the high-stability fixed oscillator 223 shown in FIG. 1. When the count value becomes "20000", only one clock of the holdover reference 231 is output.

The holdover reference 231 is not only supplied to the PLL circuit 201 via the selector 222 shown in FIG. 1, but also serves as the latch output 254 of the latch circuit 253. In the latch circuit 253, the output 252 of the adder 251 is latched in this situation. This is the situation indicated by reference number "2" in FIG. 4.

The output frequency monitor value 229 maintains "−1" in the latch timing indicated by the reference number "2". The adder 251 then adds the absolute value "1", the latch output 254 of the latch circuit 253, and the mask output 259 of the calculation result masking circuit 258. Here, the latch output 254 is "1", which is the value obtained when the reference number is "1". The calculation result 257 obtained by subtracting the value "A" from the value "B", and "0" as the output value 246 are input to the calculation result masking circuit 258. The calculation result masking circuit 258 masks the calculation result 257 when the output value 246 is "0". Accordingly, the calculation result 257 that is "−1999" as a result of "1−2000" is masked in this case, and "0" is input to the adder 251.

As a result, where the reference number is "2", the adder 251 adds "1", "1", and "0", and the value to be latched in the latch circuit 253 becomes "2". The comparator circuit 256 compares the value "2" as the latch output 254 with the value "2000" that is the count number 255 required for the averaging operation. In this case, the count number 255 "2000" is larger. Therefore, the comparator circuit 256 outputs "0" as the output value 246.

Accordingly, the circuit operation to be performed thereafter where the reference number is "2" is the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

As described above, with the output frequency monitor value 229 being "−1", the circuit operation is the same as the circuit operation performed when the output frequency monitor value 229 is "+1", until the reference number is "1999". Up until this point, the sign adding circuit 247 adds "−" to "0" as the output value 246, and outputs "0". However, when the reference number turns "2000", the sign adding circuit 247 adds "−" to "1" as the output value 246, and outputs "−1".

As a result, the counter circuit 249 loads the initial value "−1" as the count value. When the counter circuit 249 detects the clock signal 224 output from the high-stability fixed oscillator 223 for the "20001"st times, the count value becomes "20000", and one clock of the holdover reference 231 is output, although, until this point, one clock of the holdover reference 231 is output every time the counter circuit 249 detects the clock signal 224 for the "20000"th time.

Meanwhile, when the output value 246 of the comparator circuit 256 becomes "1", the latch circuit 253 is reset. As a result, where the reference number is "2001", the circuit operation is the same as the circuit operation performed where the reference number is "1". The same procedures as above are repeated thereafter. Where the reference number is "4000", one clock of the holdover reference 231 is output when the clock signal 224 is detected for the "20001"st time, as in the case where the reference number is "2000".

As described above, one clock of the holdover reference 231 is normally output every time the clock signal 224 of 40 MHz is detected for the "20000"th time. However, every time the reference number is incremented for the "2000"th time, one clock of the holdover reference 231 is output when the clock signal 224 is detected for the "20001"st time. In this manner, the number of clocks of the holdover reference 231 per unit time is increased, so as to correct the output frequency monitor value 229 when the output frequency monitor value 229 is "−1".

FIG. 5 shows variations of values observed in the holdover reference generating circuit 226 in a case where the output frequency monitor value 229 is "+400", or a mean frequency of "+10" ppm is obtained as the output reference. The following is a description with reference to both FIG. 2 and FIG. 5. As shown in FIG. 5, every time the latch circuit 253 of the holdover reference generating circuit 226 latches a value, the reference number used for explaining the circuit operation is incremented by 1.

Where the reference number is "1", the output frequency monitor value 229 is "+400", and the value latched in the latch circuit 253 is "1". The comparator circuit 256 compares a value "A" that is the count number 255 required for the averaging operation with a value "B" that is the latch output 254 of the latch circuit 253. If the value "A" is larger than the value "B", the comparator circuit 256 outputs a comparison result "0" as the output value 246. If the value "B" is equal to or larger than the value "A", the comparator circuit 256 outputs a comparison result "1" as the output value 246. In this example case, the value "2000" as the value "A" is larger than the value "400" as the value "B", the output value 246 as the comparison result is "0".

The comparison result "0" as the output value 246 is input to the sign adding circuit 247. The sign adding circuit 247 adds the sign "+" to "0", and outputs "0", which remains unchanged. Accordingly, the counter circuit 249 loads the initial value "0" as the count value. In this situation, the counter circuit 249 counts the number of times the clock signal 224 of 40 MHz is output from the high-stability fixed oscillator 223 shown in FIG. 1. When the count value becomes "20000", only one clock of the holdover reference 231 is output.

The holdover reference 231 is not only supplied to the PLL circuit 201 via the selector 222 shown in FIG. 1, but also serves as the latch output 254 of the latch circuit 253. In the latch circuit 253, the output 252 of the adder 251 is latched in this situation. This is the situation indicated by reference number "2" in FIG. 5.

The output frequency monitor value 229 maintains "+400" in the latch timing indicated by the reference number "2". The adder 251 then adds the absolute value "400", the latch output 254 of the latch circuit 253, and the mask output 259 of the calculation result masking circuit 258. Here, the latch output 254 is "400", which is the value obtained when the reference number is "1". The calculation result 257 obtained by subtracting the value "A" from the value "B", and "0" as the output value 246 are input to the calculation result masking circuit 258. The calculation result masking circuit 258 masks the calculation result 257 when the output value 246 is "0". Accordingly, the calculation result 257 that is "−1600" as a result of "400−2000" is masked in this case, and "0" is input to the adder 251.

As a result, where the reference number is "2", the adder 251 adds "400", "400", and "0", and the value to be latched in the latch circuit 253 becomes "800". The comparator circuit 256 compares the value "800" as the latch output 254 with the value "2000" that is the count number 255 required for the averaging operation. In this case, the count number 255 "2000" is still larger. Therefore, the comparator circuit 256 outputs "0" as the output value 246.

Accordingly, the circuit operation to be performed thereafter where the reference number is "2" is the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

As described above, with the output frequency monitor value 229 being "+400", the circuit operation is the same as the circuit operation performed when the output frequency monitor value 229 is "+1", until the reference number is "4". Up until this point, the sign adding circuit 247 adds "+" to "0" as the output value 246, and outputs "0". However, when the reference number turns "5", the sign adding circuit 247 adds "+" to "1" as the output value 246, and outputs "+1".

As a result, the counter circuit 249 loads the initial value "+1" as the count value. When the counter circuit 249 detects the clock signal 224 output from the high-stability fixed oscillator 223 for the "19999"th time, the count value becomes "20000", and one clock of the holdover reference 231 is output, although, until this point, one clock of the holdover reference 231 is output every time the counter circuit 249 detects the clock signal 224 for the "20000"th time.

Meanwhile, when the output value 246 of the comparator circuit 256 becomes "1", the latch circuit 253 is reset. As a result, where the reference number is "6", the circuit operation is the same as the circuit operation performed where the reference number is "1". The same procedures as above are repeated thereafter. Where the reference number is "10", one clock of the holdover reference 231 is output when the clock signal 224 is detected for the "19999"th time, as in the case where the reference number is "5".

As described above, one clock of the holdover reference 231 is normally output every time the clock signal 224 of 40 MHz is detected for the "20000"th time. However, every time the reference number is incremented for the "5"th time, one clock of the holdover reference 231 is output when the clock signal 224 is detected for the "19999"th time. In this manner, the number of clocks of the holdover reference 231 per unit time is increased, so as to correct the output frequency monitor value 229 when the output frequency monitor value 229 is "+400". In this case, the clock number increasing rate per unit time is 400 times higher than in the case where the output frequency monitor value 299 is "+1" as shown in FIG. 3.

In the above cases described with reference to FIG. 3 through FIG. 5, the value obtained by dividing the value "20000" set in the counter circuit 249 by the absolute value of the output frequency monitor value 229 is an integer. In reality, however, any integer may be stored in the memory 228 shown in FIG. 1. An operation to be performed where an integer cannot be obtained by dividing the value "20000" set in the counter circuit 249 by the output frequency monitor value 229 is now described.

FIG. 6 shows variations of values observed in the holdover reference generating circuit 226 in a case where the output frequency monitor value 229 is "+600", or a mean frequency of "+15" ppm is obtained as the output reference. The following is a description with reference to both FIG. 2 and FIG. 6. As shown in FIG. 6, every time the latch circuit 253 of the holdover reference generating circuit 226 latches a value, the reference number used for explaining the circuit operation is incremented by 1.

Where the reference number is "1", the output frequency monitor value 229 is "+600", and the value latched in the latch circuit 253 is "1". The comparator circuit 256 compares a value "A" that is the count number 255 required for the averaging operation with a value "B" that is the latch output 254 of the latch circuit 253. If the value "A" is larger than the value "B", the comparator circuit 256 outputs a comparison result "0" as the output value 246. If the value "B" is equal to or larger than the value "A", the comparator circuit 256 outputs a comparison result "1" as the output value 246. In this example case, the value "2000" as the value "A" is larger than the value "600" as the value "B", the output value 246 as the comparison result is "0".

The comparison result "0" as the output value 246 is input to the sign adding circuit 247. The sign adding circuit 247 adds the sign "+" to "0", and outputs "0", which remains unchanged. Accordingly, the counter circuit 249 loads the initial value "0" as the count value. In this situation, the counter circuit 249 counts the number of times the clock signal 224 of 40 MHz is output from the high-stability fixed oscillator 223 shown in FIG. 1. When the count value becomes "20000", only one clock of the holdover reference 231 is output.

The holdover reference 231 is not only supplied to the PLL circuit 201 via the selector 222 shown in FIG. 1, but also serves as the latch output 254 of the latch circuit 253. In the latch circuit 253, the output 252 of the adder 251 is latched in this situation. This is the situation indicated by reference number "2" in FIG. 6.

The output frequency monitor value 229 maintains "+600" in the latch timing indicated by the reference number "2". The adder 251 then adds the absolute value "600", the latch output 254 of the latch circuit 253, and the mask output 259 of the calculation result masking circuit 258. Here, the latch output 254 is "600", which is the value obtained where the reference number is "1". The calculation result 257 obtained by subtracting the value "A" from the value "B", and "0" as the output value 246 are input to the calculation result masking circuit 258. The calculation result masking circuit 258 masks the calculation result 257 when the output value 246 is "0". Accordingly, the calculation result 257 that is "−1400" as a result of "600−2000" is masked in this case, and "0" is input to the adder 251.

As a result, where the reference number is "2", the adder 251 adds "600", "600", and "0", and the value to be latched in the latch circuit 253 becomes "1200". The comparator circuit 256 compares the value "1200" as the latch output 254 with the value "2000" that is the count number 255 required for the averaging operation. In this case, the count number 255 "2000" is still larger. Therefore, the comparator circuit 256 outputs "0" as the output value 246.

Accordingly, the circuit operation to be performed thereafter where the reference number is "2" is the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

As described above, with the output frequency monitor value 229 being "+600", the circuit operation is the same as the circuit operation performed when the output frequency monitor value 229 is "+1", until the reference number is "3". Up until this point, the sign adding circuit 247 adds "+" to "0" as the output value 246, and outputs "0". However, when the reference number turns "4", the sign adding circuit 247 adds "+" to "1" as the output value 246, and outputs "+1".

As a result, the counter circuit 249 loads the initial value "+1" as the count value. When the counter circuit 249 detects the clock signal 224 output from the high-stability fixed oscillator 223 for the "19999"th time, the count value becomes "20000", and one clock of the holdover reference 231 is output, although, until this point, one clock of the holdover reference 231 is output every time the counter circuit 249 detects the clock signal 224 for the "20000"th time.

Meanwhile, when the output value 246 of the comparator circuit 256 becomes "1", the latch circuit 253 is reset. As a result, where the reference number is "5", the adder 251 adds the absolute value "600", the latch output 254 of the latch circuit 253, and the mask output 259 of the calculation result masking circuit 258. Here, the latch output 254 is "0", as the latch circuit 253 is reset. The calculation result masking circuit 258 outputs the calculation result 257 when the output value 246 is "1". Accordingly, the value "400" as a result of "2400−2000" as the calculation result 257 in this case is input to the adder 251. By doing so, the remainder of the previous division is carried over to the next calculation.

Accordingly, where the reference number is "5", the adder 251 adds "600", "0", and "400", and the value to be latched in the latch circuit 253 becomes "1000". The comparator circuit 256 compares the value "1000" as the latch output 254 with the value "2000" that is the count number 255 required for the averaging operation. In this case, the count number 255 "2000" is still larger. Therefore, the comparator circuit 256 outputs "0" as the output value 246.

Accordingly, the circuit operation to be performed thereafter where the reference number is "5" is the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

The circuit operation to be performed where the reference number is "6" is also basically the same as the circuit operation performed where the reference number is "1". More specifically, the counter circuit 249 loads the initial value "0" as the count value. In this situation, the counter circuit 249 counts the number of times the clock signal 224 of 40 MHz is output. When the count value becomes "20000", only one clock of the holdover reference 231 is output.

The circuit operation to be performed where the reference number is "7" is basically the same as the circuit operation performed where the reference number is "4". More specifically, the counter circuit 249 loads the initial value "+1" as the count value. In this situation, the counter circuit 249 detects the clock signal 224 for the "19999"th time, the count value becomes "20000", and only one clock of the holdover reference 231 is output.

Meanwhile, when the output value 246 of the comparator circuit 256 becomes "1", the latch circuit 253 is reset. As a result, where the reference number is "8", the adder 251 adds the absolute value "600", the latch output 254 of the latch circuit 253, and the mask output 259 of the calculation result masking circuit 258. Here, the latch output 254 is "0", as the latch circuit 253 is reset. The calculation result masking circuit 258 outputs the calculation result 257 when the output value 246 is "1". Accordingly, the value "200" as a result of "2200−2000" as the calculation result 257 in this case is input to the adder 251. By doing so, the remainder of the previous division is carried over to the next calculation.

Accordingly, where the reference number is "8", the adder 251 adds "600", "0", and "200", and the value to be latched in the latch circuit 253 becomes "800". The comparator circuit 256 compares the value "800" as the latch output 254 with the value "2000" that is the count number 255 required for the averaging operation. In this case, the count number 255 "2000" is still larger. Therefore, the comparator circuit 256 outputs "0" as the output value 246.

Thereafter, every time the value latched in the latch circuit 253 becomes larger than "2000", the surplus is added to the value to be latched next time. Also, where the value to be latched in the latch circuit 253 is equal to or larger than "2000", one clock of the holdover reference 231 is output when the count value of the counter circuit 249 becomes "19999". In other cases, when the count value of the counter circuit 249 becomes "20000", one clock of the holdover reference 231 is output.

In the above described embodiment, the holdover reference 231 generated according to the high-stability fixed oscillator 223 serves as the reference for the PLL circuit 201. With this arrangement, the stability of ±0.37 ppm/1 day, which is the value obtained by adding the initial offset of ±0.05 ppm to ±0.32 ppm, can be achieved.

[First Modification]

FIG. 7 schematically shows the structure of a clock supply device in a first modification of the present invention. In the clock supply device 200A shown in FIG. 7, the same components as those of the clock supply device 200 of the embodiment shown in FIG. 1 are denoted by the same reference numerals as those shown in FIG. 1, and explanation of them is omitted here.

In the clock supply device 200A of the first modification, the output frequency monitor 225 shown in FIG. 1 does not exist, but an input frequency monitor 301 that monitors the frequency of the input reference signal 204 is provided instead. The input frequency monitor 301 receives the clock signal 224 output from the high-stability fixed oscillator 223 and the input reference signal 204, and stores a frequency monitor signal 302 as a digital signal representing the frequency of the input reference signal 204 in a memory 228A. Instead of the output frequency monitor value 229 of the embodiment shown in FIG. 1, an input frequency monitor value 303 that is read out from the memory 228A is supplied to a holdover reference generating circuit 226A.

The holdover reference generating circuit 226A is the same as the holdover reference generating circuit 226 shown in FIG. 2. A holdover reference 231A that is output from the holdover reference generating circuit 226A is supplied together with the input reference signal 204 to the selector 222. When detecting a frequency error such as breaking of the input reference signal 204, the frequency error monitoring circuit 221 switches the signal 203 from the input reference signal 204 to the holdover reference 231A, and then outputs the signal 203.

The clock supply device 200A of the first modification exhibits its effects when the PLL circuit 201 is not in synchronization with the input reference signal 204 as in the initial state of a synchronizing operation. If an error occurs in the input reference signal 204 when the frequency of the output clock signal 217 is not set at a frequency predetermined by the dividing rate of the divider 211 immediately after activation of the PLL circuit 201, for example, a reference frequency for the synchronization no longer exists in conventional cases.

In the clock supply device 200A of the first modification of the present invention, the input reference signal 204 is monitored since the start of a synchronizing operation of the PLL circuit 201. Accordingly, if the frequency error monitoring circuit 221 detects a frequency error in the input reference signal 204 immediately after the synchronizing operation is started, the input frequency monitor value 303A is read out from the memory 228A, and the selector 222 selects the holdover reference 231A output from the holdover reference generating circuit 226A and inputs the holdover reference 231A to the PLL circuit 201.

The frequency monitor signal 302 is not a digital signal that represents the input reference signal 204 without an error, but the holdover reference generating circuit 226A averages the frequency monitor signal 302 so as to satisfy the predetermined standards and then outputs the averaged result as the holdover reference 231A. Accordingly, even if a frequency error is detected in the input reference signal 204 where synchronization of the PLL circuit 201 is not complete, phase synchronization according to the input reference signal 204 can be performed.

In the first modification, however, after a frequency error is detected in the input reference signal 204, the holdover reference generating circuit 226A outputs a fixed value as the holdover reference 231A in the form of a mean signal.

[Second Modification]

Figure 8:
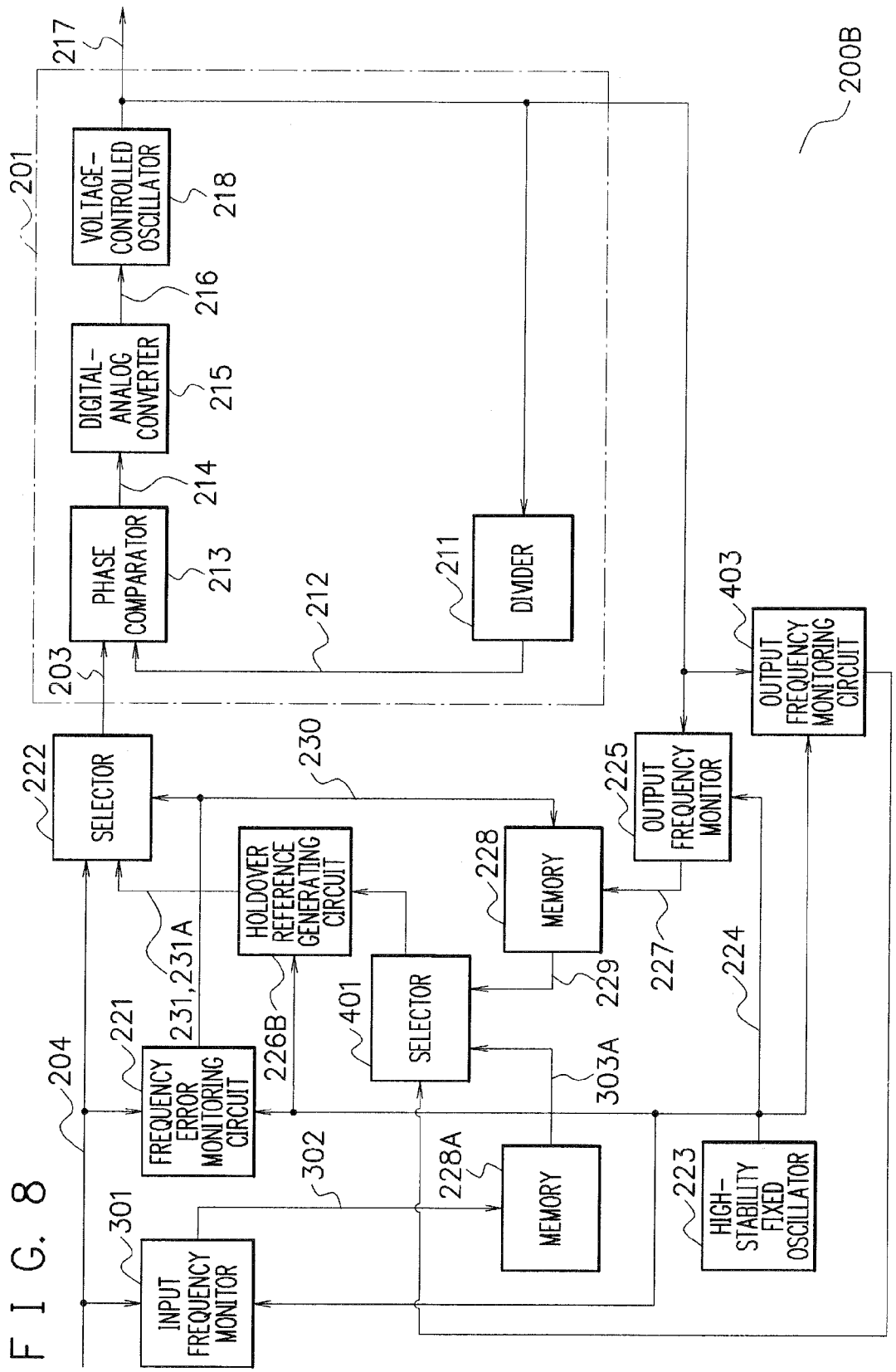
FIG. 8 is a block diagram schematically showing the structure of a clock supply device in a second modification of the present invention.

FIG. 8 schematically shows the structure of a clock supply device in a second modification of the present invention. In the clock supply device 200B shown in FIG. 8, the same components as those of the clock supply devices 200 and 200A shown in FIG. 1 and FIG. 7 are denoted by the same reference numerals as those shown in FIG. 1 and FIG. 7, and explanation of them is omitted here.

The clock supply device 200B of the second modification has a circuit structure that combines the embodiment shown in FIG. 1 and the first modification shown in FIG. 7. More specifically, when an error occurs in the input reference signal 204 before synchronization of the PLL circuit 201 is completed, an input frequency monitor value 303A is read out from the memory 228A, and the input frequency monitor value 303A is supplied to a holdover reference generating circuit 226B via a selector 401 that is newly provided.

If an error is detected in the input reference signal 204 after the synchronization of the PLL circuit 201 is completed, the output frequency monitor value 229 is read out from the memory 228 storing the digital value 227 output from the output frequency monitor 225. The output frequency monitor value 229 is then supplied to the holdover reference generating circuit 226B via the newly added selector 401.

The newly added selector 401 is switched by an output frequency monitoring circuit 403 that receives the output clock signal 217 that is output from the PLL circuit 201 and the clock signal 224 that is output from the high-stability fixed oscillator 223. More specifically, the output frequency monitoring circuit 403 determines whether synchronization of the PLL circuit 201 is completed, based on the variation of the output clock signal 217 with respect to the clock signal 224. If the synchronization of the PLL circuit 201 is not completed, the holdover reference 231A is input to the PLL circuit 201, with the input reference signal 204 detected by the input frequency monitor 301 being referred to. If a frequency error occurs in the input reference signal 204 during any other period, the holdover reference 231 is input to the PLL circuit 201, with the use of the output frequency monitor value 229 read out from the memory 228.

When the output frequency monitor value 229 read from the memory 228 is used, the holdover reference generating circuit 226B of the second modification performs the same circuit operation as the holdover reference generating circuit 226 of the embodiment. When the input frequency monitor value 303A read from the memory 228A is used, the holdover reference generating circuit 226B of the second modification performs the same circuit operation as the holdover reference generating circuit 226A of the first modification.

In the above described embodiment, specific frequencies are described. However, those frequencies are merely examples, and it is of course possible to use various frequencies in the present invention, so as to satisfy various standards.

In the second modification, the output frequency monitoring circuit 403 is employed to determine whether synchronization of the PLL circuit 201 is completed. However, the present invention is not limited to that arrangement. For example, the phase difference between the signal 203 to be input to the phase comparator 213 of the PLL circuit 201 via the selector 222 and the output 212 of the divider 211 may be monitored to determine a synchronized state.

A second exemplary embodiment is that a digital signal is generated by sampling and quantizing the frequency of an output signal of a conventional PLL circuit, using the output of an oscillator or the like. The digital signal is sequentially stored as a record of variations of the output signal of the PLL circuit in the output frequency value storing unit. Meanwhile, the averaging unit inverse-quantizes the digital signal stored in the output frequency value storing unit, averages the digital signal over a certain period of time, and sequentially outputs the averaged digital signal. By doing so, averaging in terms of time is performed so as to eliminate errors. The error detecting unit detects a frequency error in the input signal to be input to the PLL circuit. Once the error detecting unit detects a frequency error in the input signal, the signal switching unit inputs the signal having an inverse-quantized frequency, instead of the input signal, to the PLL circuit. The signal has the frequency inverse-quantized in accordance with the dividing rate of the PLL circuit, and is output from the averaging unit. In this manner, once the error detecting unit detects a frequency error in the input signal, the signal to be input to the PLL circuit is switched to the averaged input signal stored as the past data. Accordingly, holdover is performed on the basis of the output signal that is observed before the error detection and has an error eliminated, so that the frequency on the output side of the PLL circuit observed immediately before the occurrence of the error can be maintained with high precision.

A third exemplary embodiment is that a digital signal corresponding to an input signal to be input to a conventional PLL circuit is generated by sampling and quantizing the frequency of the input signal, using the output of an oscillator or the like. The digital signal is sequentially stored as a record of variations of the input signal of the PLL circuit in the input frequency value storing unit. Meanwhile, the averaging unit inverse-quantizes the digital signal stored in the input frequency value storing unit, averages the digital signal over a certain period of time, and sequentially outputs the averaged digital signal. By doing so, averaging in terms of time is performed so as to eliminate errors. The error detecting unit detects a frequency error in the input signal to be input to the PLL circuit. Once the error detecting unit detects a frequency error in the input signal, the signal switching unit inputs the signal having an inverse-quantized frequency, instead of the input signal, to the PLL circuit. The signal has the frequency inverse-quantized, and is output from the averaging unit. In this manner, once the error detecting unit detects a frequency error in the input signal, the signal to be input to the PLL circuit is switched to the averaged input signal stored as the past data. Accordingly, holdover is performed on the basis of the input signal that is observed before the error detection and has an error eliminated, so that the frequency on the input side of the PLL circuit observed immediately before the occurrence of the error can be maintained with high precision.

A fourth exemplary embodiment is that a digital signal corresponding to an output signal of a conventional PLL circuit at a predetermined rate is generated by sampling and quantizing the frequency of the output signal, using the output of an oscillator or the like. The digital signal is sequentially stored as a record of variations of the output signal of the PLL circuit in the output frequency value storing unit. Another digital signal corresponding to an input signal to be input to the PLL circuit is generated by sampling and quantizing the frequency of the input signal, using the output of an oscillator or the like. The digital signal is sequentially stored in the input frequency value storing unit. Meanwhile, the averaging unit receives the digital signal stored in the output frequency value storing unit and the digital signal stored in the input frequency value storing unit via different routes from each other. The averaging unit then inverse-quantizes each of the digital signals, averages each of the digital signals over a certain period of time, and sequentially outputs the averaged digital signals via different routes from each other. By doing so, averaging in terms of time is performed so as to eliminate errors. The error detecting unit detects a frequency error in the input signal to be input to the PLL circuit. The phase synchronization completion determining unit determines whether phase synchronization of the PLL circuit is completed. In a case where a frequency error in the input signal is detected before the phase synchronization of the PLL circuit is completed, the signal switching unit inputs the signal having an inverse-quantized frequency, instead of the input signal, to the PLL circuit once the error detecting unit detects a frequency error in the input signal. The signal has the frequency inverse-quantized and is output from the averaging unit. In this manner, once the error detecting unit detects a frequency error in the input signal, the signal to be input to the PLL circuit is switched to the averaged input signal stored as the past data. Accordingly, holdover is performed on the basis of the input signal that is observed before the error detection and has an error eliminated, so that the frequency on the input side of the PLL circuit observed immediately before the occurrence of the error can be maintained with high precision. On the other hand, in a case where a frequency error in the input signal is detected after the phase synchronization of the PLL circuit is completed, the signal switching unit inputs the signal having an inverse-quantized frequency, instead of the input signal, to the PLL circuit once the error detecting unit detects a frequency error in the input signal. The signal has the frequency inverse-quantized in accordance with the dividing rate of the divider, and is output from the averaging unit. In this manner, once the error detecting unit detects a frequency error in the input signal, the signal to be input to the PLL circuit is switched to the averaged input signal stored as the past data. Accordingly, holdover is performed on the basis of the output signal or the input signal of the PLL circuit that is observed before the error detection and has an error eliminated, so that the frequency on the output side of the PLL circuit observed immediately before the occurrence of the error can be maintained with high precision.

A fifth exemplary embodiment is that a digital signal is generated by sampling and quantizing the frequency of an output signal of a conventional PLL circuit, using the output of an oscillator or the like. The digital signal is sequentially stored as a record of variations of the output signal of the PLL circuit in the output frequency value storing unit. Meanwhile, in the averaging step, the digital signal stored in the output frequency value storing unit is inverse-quantized and averaged over a certain period of time, and the averaged digital signal is sequentially output. By doing so, averaging in terms of time is performed so as to eliminate errors. In the error detecting step, a frequency error in the input signal to be input to the PLL circuit is detected. Once a frequency error in the input signal is detected in the error detecting step, the signal having an inverse-quantized frequency, instead of the input signal, is input to the PLL circuit in the signal switching step. The signal has the frequency inverse-quantized in accordance with the dividing rate of the PLL circuit, and is output from the averaging unit. In this manner, once a frequency error in the input signal is detected in the error detecting step, the signal to be input to the PLL circuit is switched to the averaged input signal stored as the past data. Accordingly, holdover is performed on the basis of the output signal that is observed before the error detection and has an error eliminated, so that the frequency on the output side of the PLL circuit observed immediately before the occurrence of the error can be maintained with high precision.

A sixth exemplary embodiment is that a digital signal corresponding to an input signal to be input to a conventional PLL circuit is generated by sampling and quantizing the frequency of the input signal, using the output of an oscillator or the like. The digital signal is sequentially stored as a record of variations of the input signal of the PLL circuit in the input frequency value storing unit. Meanwhile, in the averaging step, the digital signal stored in the input frequency value storing unit is inverse-quantized and averaged over a certain period of time, and the averaged digital signal is sequentially output. By doing so, averaging in terms of time is performed so as to eliminate errors. In the error detecting step, a frequency error in the input signal to be input to the PLL circuit is detected. Once a frequency error in the input signal is detected in the error detecting step, the signal having an inverse-quantized frequency, instead of the input signal, is input to the PLL circuit in the signal switching step. The signal has the frequency inverse-quantized and is output as a result of the averaging step. In this manner, once a frequency error in the input signal is detected in the error detecting step, the signal to be input to the PLL circuit is switched to the averaged input signal stored as the past data. Accordingly, holdover is performed on the basis of the input signal that is observed before the error detection and has an error eliminated, so that the frequency on the input side of the PLL circuit observed immediately before the occurrence of the error can be maintained with high precision.

A seventh exemplary embodiment is that a digital signal corresponding to an output signal of a conventional PLL circuit is generated by sampling and quantizing the frequency of the output signal, using the output of an oscillator or the like. The digital signal is sequentially stored as a record of variations of the output signal of the PLL circuit in the output frequency value storing unit. Another digital signal corresponding to an input signal to be input to the PLL circuit is generated by sampling and quantizing the frequency of the input signal, using the output of an oscillator or the like. The digital signal is sequentially stored in the input frequency value storing unit. Meanwhile, in the averaging step, the digital signal stored in the output frequency value storing unit and the digital signal stored in the input frequency value storing unit are input via different routes from each other. Each of the digital signals is then inverse-quantized and averaged over a certain period of time. The averaged digital signals are sequentially output via different routes from each other. By doing so, averaging in terms of time is performed so as to eliminate errors. In the error detecting step, a frequency error in the input signal to be input to the PLL circuit is detected. In the phase synchronization completion determining step, checking is performed to determine whether phase synchronization of the PLL circuit is completed. In a case where a frequency error in the input signal is detected before the phase synchronization of the PLL circuit is completed, the signal having an inverse-quantized frequency, instead of the input signal, is input to the PLL circuit in the signal switching step, once the error detecting unit detects a frequency error in the input signal. The signal has the frequency inverse-quantized and is output from the averaging unit. In this manner, once a frequency error in the input signal is detected in the error detecting step, the signal to be input to the PLL circuit is switched to the averaged input signal stored as the past data. Accordingly, holdover is performed on the basis of the input signal that is observed before the error detection and has an error eliminated, so that the frequency on the input side of the PLL circuit observed immediately before the occurrence of the error can be maintained with high precision. On the other hand, in a case where a frequency error in the input signal is detected after the phase synchronization of the PLL circuit is completed, the signal having an inverse-quantized frequency, instead of the input signal, is input to the PLL circuit in the signal switching step, once a frequency error in the input signal is detected in the error detecting step. The signal has the frequency inverse-quantized in accordance with the dividing rate of the divider, and is output as a result of the averaging step. In this manner, once a frequency error in the input signal is detected in the error detecting step, the signal to be input to the PLL circuit is switched to the averaged input signal stored as the past data. Accordingly, holdover is performed on the basis of the output signal or the input signal of the PLL circuit that is observed before the error detection and has an error eliminated, so that the frequency on the output side of the PLL circuit observed immediately before the occurrence of the error can be maintained with high precision.

As set forth above, an exemplary advantage according to the invention is that the input signal to be input to the PLL circuit or the output signal to be output from the PLL circuit is averaged, and switching to the averaged input signal or the averaged output signal that is slightly delayed in terms of time is performed at the time of holdover. Thus, holdover characteristics with high stability can be achieved. Also, phase gaps can be eliminated by setting the averaged input signal or the averaged output signal as the reference for the PLL circuit. Further, according to the present invention, an inexpensive, small-sized PLL circuit equipped with a conventional voltage-controlled oscillator can be used. Thus, a small-sized clock supply device and a small-sized device for realizing a clock supply method can be produced at lower costs.

Furthermore, even if an error such as breaking of the input signal occurs immediately after the PLL circuit is activated, holdover can be performed on the basis of a signal with a frequency obtained by averaging the frequency of the past input signal including the input signal generated immediately before the error occurrence.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A clock supply circuit comprising:
   an averaging unit that inverse-quantizes digital signals, averages the digital signals over a certain period of time, and sequentially outputs the averaged digital signals;
   a PLL circuit that includes a divider and a voltage-controlled oscillator, the voltage-controlled oscillator outputting an output signal to the outside, the output signal having a frequency in phase synchronization with an input signal in accordance with a dividing rate of the divider;
   an output frequency value storing unit that stores a digital signal obtained by sampling and quantizing the frequency of the output signal of the PLL circuit, the digital signal being sequentially stored in chronological order;
   an error detecting unit that detects a frequency error in the input signal to be input to the PLL circuit; and
   a signal switching unit that sequentially inputs a signal, instead of the input signal, to the PLL circuit after the error detecting unit detects a frequency error in the input signal, the signal having a frequency inverse-quantized in accordance with the dividing rate of the divider, the signal being output from the averaging unit,
   wherein the averaged digital signals are selected instead of input signals when frequency errors are found in the input signals, and
   wherein the averaging unit performs an averaging operation to absorb an error in terms of time with respect to the frequency of each digital signal at the time of storage of the digital signal into the output frequency value storing unit.

2. The clock supply circuit according to claim 1, wherein the error detecting unit detects a frequency error by comparing the frequency of a signal output from a high stability oscillator with the frequency of the input signal, the high stability oscillator outputting the signal having constant frequency with high stability, the constant frequency having higher stability than the frequency generated by the voltage-controlled oscillator.

3. A clock supply circuit comprising:
an averaging unit that inverse-quantizes digital signals, averages the digital signals over a certain period of time, and sequentially outputs the averaged digital signals;
a PLL circuit that includes a divider and a voltage-controlled oscillator, the voltage-controlled oscillator outputting an output signal to the outside, the output signal having a frequency in phase synchronization with an input signal in accordance with a dividing rate of the divider;
an input frequency value storing unit that stores a digital signal obtained by sampling and quantizing the frequency of the input signal of the PLL circuit, the digital signal being sequentially stored in chronological order;
an error detecting unit that detects a frequency error in the input signal to be input to the PLL circuit; and
a signal switching unit that sequentially inputs a signal, instead of the input signal, to the PLL circuit after the error detecting unit detects a frequency error in the input signal, the signal having a frequency inverse-quantized, the signal being output from the averaging unit,
wherein the averaged digital signals are selected instead of input signals when frequency errors are found in the input signals, and
wherein the averaging unit performs an averaging operation to absorb an error in terms of time with respect to the frequency of each digital signal at the time of storage of the digital signal into the input frequency value storing unit.

4. The clock supply circuit according to claim 3, wherein the error detecting unit detects a frequency error by comparing the frequency of a signal output from a high stability oscillator with the frequency of the input signal, the high stability oscillator outputting the signal having constant frequency with high stability, the constant frequency having higher stability than the frequency generated by the voltage-controlled oscillator.

5. A clock supply circuit comprising:
an averaging unit that inverse-quantizes digital signals, averages the digital signals over a certain period of time, and sequentially outputs the averaged digital signals;
a PLL circuit that includes a divider and a voltage-controlled oscillator, the voltage-controlled oscillator outputting an output signal to the outside, the output signal having a frequency in phase synchronization with an input signal in accordance with a dividing rate of the divider;
an output frequency value storing unit that stores a digital signal obtained by sampling and quantizing the frequency of the output signal of the PLL circuit, the digital signal being sequentially stored in chronological order;
an input frequency value storing unit that stores a digital signal obtained by sampling and quantizing the frequency of the input signal of the PLL circuit, the digital signal being sequentially stored in chronological order;
an error detecting unit that detects a frequency error in the input signal to be input to the PLL circuit;
a phase synchronization completion determining unit that determines whether phase synchronization of the PLL circuit is completed; and
a signal switching unit that sequentially inputs a signal, instead of the input signal, to the PLL circuit after the error detecting unit detects a frequency error in the input signal to be input to the PLL signal where the phase synchronization completion determining unit determines that the phase synchronization is not completed, the signal having a frequency inverse-quantized and being output from the averaging unit,
the signal switching unit sequentially inputting a signal, instead of the input signal, to the PLL circuit after the error detecting unit detects a frequency error in the input signal to be input to the PLL signal where the phase synchronization completion determining unit determines that the phase synchronization is completed, the signal having a frequency inverse-quantized in accordance with the dividing rate of the divider, the signal being output from the averaging unit,
wherein the averaged digital signals are selected instead of input signals when frequency errors are found in the input signals, and
wherein the averaging unit performs an averaging operation to absorb an error in terms of time with respect to the frequency of each digital signal at the time of storage of the digital signal into the output frequency value storing unit.

6. The clock supply circuit according to claim 5, wherein the error detecting unit detects a frequency error by comparing the frequency of a signal output from a high stability oscillator with the frequency of the input signal, the high stability oscillator outputting the signal having constant frequency with high stability, the constant frequency having higher stability than the frequency generated by the voltage-controlled oscillator.

7. A clock supply method comprising:
inverse-quantizing digital signals, averaging the digital signals over a certain period of time, and sequentially outputting the averaged digital signals;
storing the digital signals obtained by sampling and quantizing the frequency of an output signal of a PLL circuit that includes a divider and a voltage-controlled oscillator, the voltage-controlled oscillator outputting the output signal to the outside, the output signal having a frequency in phase synchronization with an input signal in accordance with a dividing rate of the divider, the digital signals being sequentially stored in chronological order;
detecting a frequency error in the input signal to be input to the PLL circuit;
determining whether phase synchronization of the PLL circuit is completed;
sequentially inputting a signal, instead of the input signal, to the PLL circuit after detecting a frequency error in the input signal to the PLL circuit where the determining step determines that the phase synchronization is not complete, the signal having a frequency inverse-quantized and being output as a result of the averaging;
sequentially inputting a signal, instead of the input signal, to the PLL circuit after detecting a frequency error in the input signal to the PLL circuit where the determining step determines that the phase synchronization is complete, the signal having a frequency inverse-quantized in accordance with the dividing rate of the divider, the signal being output as a result of the averaging; and
inputting a signal sequentially, instead of the input signal, to the PLL circuit after detecting a frequency error in the input signal, the signal having a frequency inverse-quantized in accordance with the dividing rate of the divider, the signal being sequentially output as a result of the averaging,
wherein the averaged digital signals are selected instead of input signal when frequency errors are found in the input signal, and wherein the averaging absorbs an error in terms of time with respect to the frequency of each of the digital signals at the time of storing the digital signals.

8. A clock supply method comprising:

inverse-quantizing digital signals, averaging the digital signals over a certain period of time, and sequentially outputting the averaged digital signals;

storing the digital signals obtained by sampling and quantizing the frequency of an input signal of a PLL circuit that includes a divider and a voltage-controlled oscillator, the voltage-controlled oscillator outputting an output signal to the outside, the output signal having a frequency in phase synchronization with the input signal in accordance with a dividing rate of the divider, the digital signals being sequentially stored in chronological order;

detecting a frequency error in the input signal of the PLL circuit;

inputting a signal sequentially, instead of the input signal, to the PLL circuit after detecting a frequency error in the input signal, the signal having a frequency inverse-quantized, the signal being sequentially output as a result of the averaging, wherein the averaged digital signals are selected instead of input signal when frequency errors are found in the input signal, and wherein the averaging absorbs an error in terms of time with respect to the frequency of each of the digital signals at the time of storing the digital signals.

9. A clock supply method comprising:

inverse-quantizing digital signals, averaging the digital signals over a certain period of time, and sequentially outputting the averaged digital signals;

storing the digital signals obtained by sampling and quantizing the frequency of an output signal of a PLL circuit that includes a divider and a voltage-controlled oscillator, the voltage-controlled oscillator outputting the output signal to the outside, the output signal having a frequency in phase synchronization with an input signal in accordance with a dividing rate of the divider, the digital signals being sequentially stored in chronological order;

storing the digital signals obtained by sampling and quantizing the frequency of an input signal of the PLL circuit, the digital signals being sequentially stored in chronological order;

detecting a frequency error in the input signal of the PLL circuit;

sequentially inputting a signal, instead of the input signal, to the PLL circuit after detecting the frequency error in the input signal, the signal having a frequency inverse-quantized in accordance with the dividing rate of the divider, the signal being sequentially output as a result of the averaging;

wherein the averaged digital signals are selected instead of input signal when frequency errors are found in the input signal, and wherein the averaging absorbs an error in terms of time with respect to the frequency of each of the digital signals at the time of storing the digital signals from the input and output signals of the PLL circuit.

* * * * *